United States Patent [19]

Zeeb

[11] 4,132,116
[45] Jan. 2, 1979

[54] METHOD FOR LINEARIZING THE CHARACTERISTIC CURVE OF AN ELECTRONIC COMPONENT AND AN APPARATUS FOR IMPLEMENTING THE SAME

[75] Inventor: Helmut E. Zeeb, Kirchentellinsfurth, Fed. Rep. of Germany

[73] Assignee: Hewlett-Packard GmbH, Boblingen, Fed. Rep. of Germany

[21] Appl. No.: 844,327

[22] Filed: Oct. 21, 1977

[51] Int. Cl.$^2$ .............................................. G01N 7/24
[52] U.S. Cl. .............................................. 73/362 AR
[58] Field of Search .............................. 73/362 AR

[56] References Cited

U.S. PATENT DOCUMENTS

| 3,477,292 | 11/1969 | Thornton | 73/362 AR |
| 3,766,782 | 10/1973 | Shimomura | 73/362 AR |

Primary Examiner—S. Clement Swisher
Attorney, Agent, or Firm—Stephen P. Fox

[57] ABSTRACT

A method for linearizing the exponential characteristic curve of an electronic component, in particular the temperature/resistance characteristic of a thermistor is provided. The output value of the component is compared with the output value of a reference circuit varying exponentially in time and in the same sense as said characteristic, and the time interval is measured between a fixed starting moment, at which the exponential variation is already taking place, and the moment when the two output values become equal.

8 Claims, 2 Drawing Figures

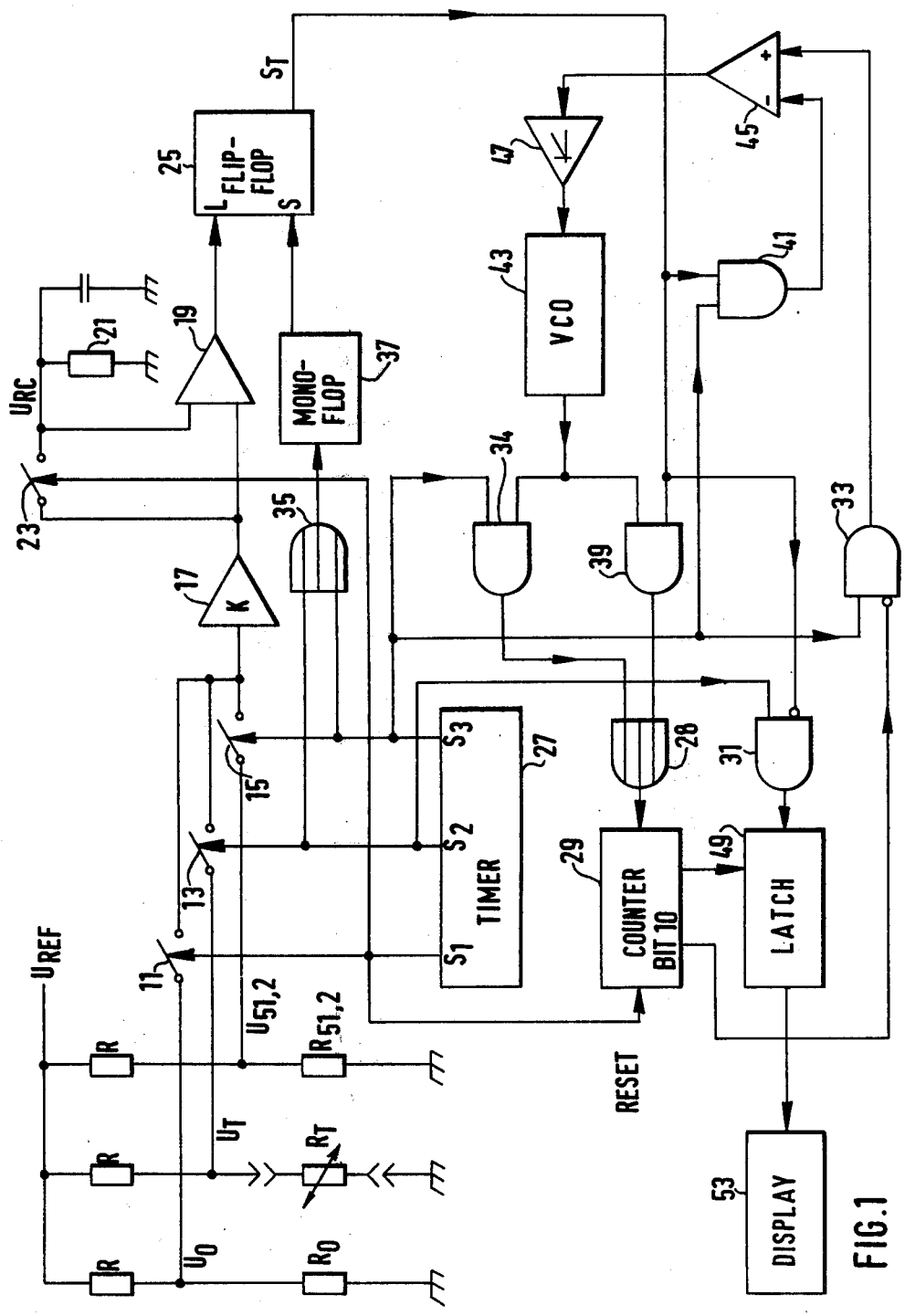

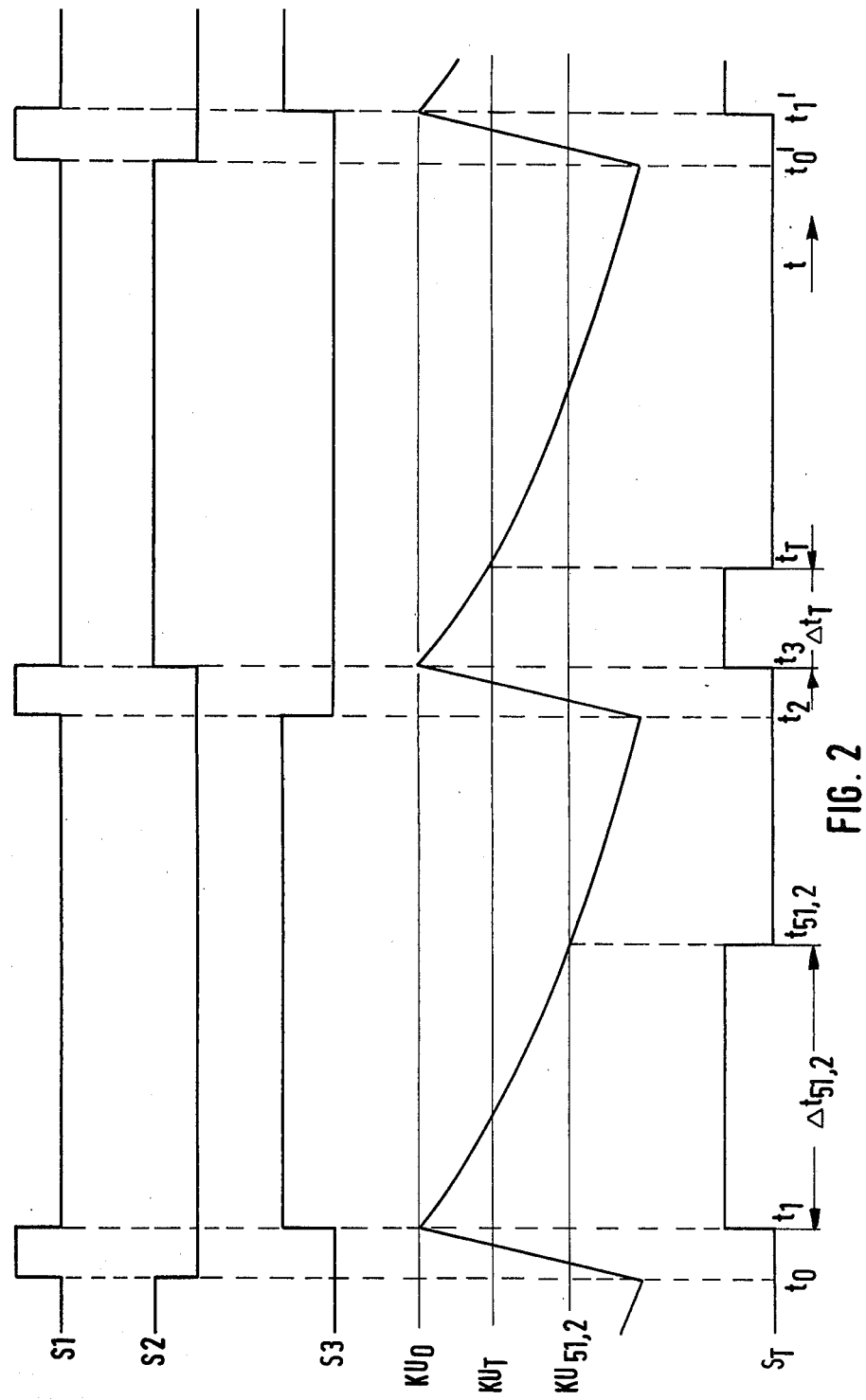

4,132,116

METHOD FOR LINEARIZING THE CHARACTERISTIC CURVE OF AN ELECTRONIC COMPONENT AND AN APPARATUS FOR IMPLEMENTING THE SAME

BACKGROUND OF THE INVENTION

Non-linear characteristic curves of electronic components are particularly disadvantageous in cases where the components are to be used for measuring purposes. If, for instance, a thermistor is used for measuring temperatures by measuring the voltage drop occuring at the thermistor when a specified current is supplied to it, it will be noted that the voltage drop decreases exponentially as the temperature rises. If this voltage is fed to an analogous measuring instrument and if one calibrates the scale in temperature units, a non-linear scale division will be obtained. When a digital indication of the temperature is desired, the thermistor curve must be linearized by a suitable circuit. Heretofore, the linearization of the exponential curve was achieved by the use of resistor networks, i.e. the exponential function was approximated via a rational function. However, such approximation is possible only over a very limited temperature range and that with decreasing accuracy.

SUMMARY OF THE INVENTION

According to the invention the output value of the component is compared with the output value of a reference circuit varying exponentially in time and the same sense as said characteristic, and the time interval is measured between a fixed starting moment, at which the exponential variation is already taking place, and the moment when the two output values become equal. The invention provides a method and an apparatus for linearizing the exponential characteristic curve of a component with sufficient accuracy and over a broad range.

In the case of a thermistor, the measured time interval is directly proportional to the input value, for instance the temperature. The time may be measured by digital means, e.g. by counting the pulses of a reference pulse train. To this end, the time constant of the output value of the reference circuit and the pulse frequency are matched in a manner to ensure that a specified number of pulses corresponds to one unit of the output value of the component, as fixed in accordance with a pre-determined scale. Thus, the counted value can be directly displayed.

BRIEF DESCRIPTION OF THE DRAWINGS

FIG. 1 shows a circuit diagram of a temperature measuring device comprising a thermistor as temperature sensor and linear display means, and FIG. 2 shows a time sequence diagram of some of the signals encountered in the circuit of FIG. 1.

DESCRIPTION OF THE PREFERRED EMBODIMENT

In FIG. 1, a temperature-responsive resistor (thermistor) $R_T$ is shown which is arranged at the point where the temperature is to be measured. $R_O$ and $R_{51,2}$ are reference resistors of high stability and accuracy with resistance values corresponding to those of the thermistor $R_T$ at 0° C. and 51.2° C., respectively. The resistors $R_O$, $R_T$ and $R_{51,2}$ are connected to a reference voltage source $U_{REF}$ via three identical resistors R. The latter are amply rated as compared to the resistors $R_O$, $R_T$ and $R_{51,2}$ and must be very exactly identical between them. The accuracy of their absolute value, however, is of minor importance. As a result of the given rating of the resistors, the currents flowing through the three branches shown in the drawing are almost identical and stable, and the voltages $U_O$, $U_T$ and $U_{51,2}$ are proportional to the resistance values $R_O$, $R_T$ and $R_{51,2}$, respectively.

The voltages $U_O$, $U_T$ and $U_{51,2}$ can be supplied to the input of a comparator 19 via switches 11, 13 and 15 and an amplifier 17 having an amplifying factor K. The other input of the comparator 19 is connected to a RC network 21 which in turn can be connected via a switch 23 to the output of the amplifier 17. The output of the comparator 19 is connected to the reset input of a flipflop 25.

The switches 11, 13, 15 and 23 are actuated by a timer 27 in accordance with a time sequence which will be described in detail below with reference to FIG. 2. The output signal S1 of the timer 27 closes the switches 11 and 23 and serves simultaneously as resetting signal for a binary counter 29. Output signals S2 and S3 emitted by the pulse generator 27 close the switches 13 and 15, respectively, and are in addition supplied to one input each of an AND gate 31 and an AND gate 33, respectively, an AND gate 34 and an AND gate 41. Further, the two output signals S2 and S3 are supplied to the two inputs of an OR gate 35.

The output of the OR gate 35 is connected to the setting input of the flipflop 25 via a monoflop 37. The output of the flipflop 25 is connected to the one input of an AND gate 39, the other input of AND gate 41 and to an inverted input of AND gate 31, while the output signal of a voltage-controlled oscillator 43 is supplied to the other input of AND date 39 and AND gate 34. The output signals of AND gates 33 and 41 are supplied to the two inputs of a differential amplifier 45 the output signal of which is supplied to an integrator 47. The output signal of integrator 47 controls the frequency of the voltage-controlled oscillator 43.

The outputs of AND gates 34 and 39 are connected via an OR gate 28 to the input of counter 29 the total output of which is connected to a latch circuit 49 and the 10th bit of which is connected to the inverted input of an AND gate 33. The 10th bit has the value 1 when the counter state is 512 or above.

Latch circuit 49 is actuated by the output signal of AND gate 31. The output signal of latch circuit 49 is supplied to a display means 53.

The function of the arrangement shown in FIG. 1 will now be described with reference to FIG. 2.

Timer 27 is designed to generate periodically the signals S1, S2 and S3 as shown in FIG. 2. Each measuring cycle commences with the calibration of the measuring arrangement. To this end, the signal S1 is initially emitted during the time interval $t_0$ and $t_1$. This closes the switches 11 and 23 and sets counter 29 to zero. Thereafter, the voltage of the capacitor of the RC network 21 is raised to $kU_O$, k being the amplifying factor of the amplifier 17. The timer interval $t_0$ to $t_1$ is designed to ensure that the capacitor of RC network 21 will be charged to $kU_O$ with absolute security.

Thereafter, the signal S1 drops to zero, while S3 returns simultaneously to its standard level, thus causing the switches 11 and 23 to open and the switch 15 to close. At the same time, monoflop 37 generates an output pulse which sets flipflop 25. Now, the capacitor of the RC network 21 is discharged in accordance with the RC time constant, and as a result the voltage $U_{RC}$ drops exponentially as shown in FIG. 2. The voltage $U_{RC}$ is supplied to the one input of comparator 19, while the voltage $kU_{51,2}$ is supplied to the other input thereof. The output signal of comparator 19 remains zero as long as the voltage $U_{RC}$ is higher than $kU_{51,2}$. At the moment $t_{51,2}$, the two input signals of comparator 19 are equal, and the comparator emits a signal to flipflop 25 which resets the latter. The period of time $t_{51,2}$ of the output signal $S_T$ of flipflop 25 corresponds to the calibration temperature of 51.2° C. This standard period of time is used for a control function which will be described below.

At the moment $t_2$, the signal S3 returns to zero, and the signal S1 is again emitted until the moment $t_3$. Between $t_2$ and $t_3$, switches 11 and 23 are again closed, while switch 15 is again open. Counter 29 is reset to zero, and the voltage $U_{RC}$ returns to $kU_O$.

The measuring interval $t_T$ proper begins at the moment $t_3$. The signal S1 returns to zero, and the signal $S_2$ is being emitted. This causes switches 11 and 23 to open, while switch 13 is at the same time closed. Thus, the voltage $kU_T$ corresponding to the temperatur to be measured is supplied to the one input of comparator 19, while the exponentially dropping voltage $U_{RC}$ is again supplied to theother input of comparator. At the moment $t_T$, the two input voltages are equal in value, and flipflop 25 is accordingly reset. Considering that the voltage $U_{RC}$ drops exponentially and that, on the other hand, the voltage $U_T$ drops likewise exponentially as the temperatur of thermistor $R_T$ rises, the interval $t_T$ is directly proportional to the temperature to be measured. If one assumes that the frequency of the voltage-controlled oscillator 43 has been set to ensure that 512 pulses are emitted during the interval $t_{51,2}$, the number of the pulses emitted during the interval $t_T$ corresponds to the temperature measured in tenths of a degree. The AND gate 39 lets this number of pulses pass to the counter 29, the open time of AND gate 39 being determined by the signal $S_T$. The value reached by counter 29 at the moment $t_T$ is transmitted to display means 53 via latch circuit 49 since at the moment $t_T$ a control signal is received by latch circuit 49 from AND gate 31. The measured value displayed by display means 53 is conserved until the next measuring interval. At the moment $t_0'$ the first measuring cycle is terminated, and a new similar measuring cycle starts.

The frequency control of the oscillator 43 operates as follows:

Over the full duration of the signal S3, pulses from oscillator 43 are supplied to counter 29 via AND gate 34. The AND gate 33 transmits to the positive input of the differential amplifier 45 a signal and continues to do so until counter 29 has reached the value 512. At the same time, the signal $S_T$, which has a duration of $t_{51,2}$, is supplied to the negative input of the differential amplifier 45. Both input signals drop simultaneously to zero when the frequency of oscillator 43 reaches the set value, i.e. when the counter reaches the value 512 at $t_{51,2}$. In these cases, the output signal of differential amplifier 45 is zero, not only in the presence of the two input values, but also when both input signals are zero. When oscillator 43 operates too quickly or too slowly, the two input signals of differential amplifier 45 drop to zero at different times, so that the oscillator will emit a negative or positive output pulse the width of which corresponds to the variation from rated frequency of oscillator 43. Integrator 47 integrates the negative and/or positive output pulses of differential amplifier 45 over successive measuring periods and delivers at its output the control voltage for oscillator 43.

Of course, it is also possible to control the time constant of the RC network 21 instead of the oscillator frequency.

The frequencies of timer 27 and oscillator 43 need not be matched. It must only be ensured that oscillator 43 can emit between two signal pulses S1 a number of counting pulses sufficient for the measuring range. The repetition frequency of the signal A1 may for instance be 20 Hz, while the frequency of oscillator 43 may for instance be 20 kHz.

What we claim is:

1. A method for linearizing the exponential characteristic curve of an electronic component, in particular the temperature/resistance characteristic of a thermistor, said method comprising the steps of comparing the output value of a component with the output value of a passive resistance-reactance circuit varying exponentially with time and in the same sense as the said characteristic; and measuring the time interval between a fixed starting moment, at which the exponential variation is already taking place, and the moment when the two outputs reach equal values.

2. A method according to claim 1, wherein a calibration is performed in addition to the measuring cycle, in which a fixed calibration value instead of the output value of the component is compared with the output value of the passive resistance-reactance circuit and in which the pulse frequency and/or the time constant of the output value of the passive circuit are set to ensure that the time interval measured in accordance with the selected scale corresponds to the calibration value.

3. An apparatus for linearizing the exponential characteristic curve of an electronic component, in particular the temperature/resistance characteristic of a thermistor, said apparatus comprising a passive resistance-reactance circuit emitting an output value varying exponentially with time and in the same sense as said characteristic; a comparator circuit which compares the two output values and emits an output signal when the two values are equal; and a time measuring circuit to which the output signal of the comparator circuit is supplied and which measures the time interval between a fixed starting moment, at which the exponential variation is already taking place, and the moment at which said output signal is received.

4. An apparatus according to claim 3, wherein calibration means are provided, the output value of which is equal to the output value of the component for a given input value of the component, and which can be connected to the comparator circuit instead of the component and wherein the pulse frequency and/or the time constant of the output value of the passive resistance-reactance circuit can be set to ensure that the time interval measured in accordance with the selected scale corresponds to the calibration value.

5. An apparatus according to claim 4, wherein switching means are provided for connecting the calibration means and the component alternately with the comparator circuit in accordance with a pre-determined time sequence, for alternate measuring and calibration.

6. An apparatus according to claims 4 or 5, wherein control means are provided for automatically resetting the pulse frequency and/or the time constant of the output value of the reference circuit in accordance with the output value of the calibration means.

7. An apparatus according to claim 4, wherein the calibration means comprises fixed resistors, the values of which correspond to those of the thermistor at predetermined calibration temperatures.

8. An apparatus according to claim 7, wherein the thermistor and the fixed resistors are connected to current sources the internal resistances of which are rated to compensate any deviations of the thermistor characteristic from the true shape of an exponential curve.

* * * * *